United States Patent
Arakawa

(10) Patent No.: US 9,651,853 B2
(45) Date of Patent: May 16, 2017

(54) LIGHT SOURCE DEVICE AND PROJECTOR

(71) Applicant: SEIKO EPSON CORPORATION, Tokyo (JP)

(72) Inventor: Osamu Arakawa, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/596,724

(22) Filed: Jan. 14, 2015

(65) Prior Publication Data

US 2015/0204517 A1    Jul. 23, 2015

(30) Foreign Application Priority Data

Jan. 20, 2014    (JP) ................. 2014-007539

(51) Int. Cl.
  *G03B 21/20*    (2006.01)
  *H01L 33/50*    (2010.01)
  *H01L 33/48*    (2010.01)
  *H01L 33/60*    (2010.01)

(52) U.S. Cl.
  CPC .......... *G03B 21/204* (2013.01); *H01L 33/505* (2013.01); *G03B 21/2066* (2013.01); *H01L 33/486* (2013.01); *H01L 33/60* (2013.01)

(58) Field of Classification Search
  CPC .. G03B 21/28; G03B 21/204; G03B 21/2013; G03B 21/2066
  See application file for complete search history.

(56) References Cited

U.S. PATENT DOCUMENTS

| | | | |
|---|---|---|---|
| 8,585,252 B2 | 11/2013 | Wanninger et al. | |
| 8,616,708 B2 * | 12/2013 | Masuda | G03B 21/14 353/84 |
| 8,757,846 B2 | 6/2014 | Otani | |
| 2005/0186407 A1 | 8/2005 | Mori et al. | |
| 2005/0211991 A1 | 9/2005 | Mori et al. | |
| 2007/0206164 A1 * | 9/2007 | Beeson | G03B 21/28 353/94 |
| 2010/0245777 A1 * | 9/2010 | Ogura | G02B 5/0215 353/38 |
| 2012/0026469 A1 * | 2/2012 | Akiyama | G02B 27/142 353/20 |
| 2012/0133903 A1 * | 5/2012 | Tanaka | G03B 21/2013 353/31 |
| 2012/0236582 A1 * | 9/2012 | Waragaya | H01L 33/507 362/510 |

(Continued)

FOREIGN PATENT DOCUMENTS

| | | |
|---|---|---|
| JP | 2005277331 A | 10/2005 |
| JP | 2009170723 A | 7/2009 |

(Continued)

*Primary Examiner* — Sultan Chowdhury
(74) *Attorney, Agent, or Firm* — Oliff PLC

(57) ABSTRACT

A light source device includes a phosphor layer having a side surface, a bottom surface, and an upper surface opposed to the bottom surface, a substrate disposed on the bottom surface side of the phosphor layer, and a reflecting member disposed outside the phosphor layer. The phosphor layer generates fluorescence in response to irradiation with excitation light. The fluorescence generated in the phosphor layer is emitted from the upper surface and the side surface. The fluorescence emitted from the side surface enters the reflecting member.

17 Claims, 7 Drawing Sheets

(56) References Cited

U.S. PATENT DOCUMENTS

2014/0022512 A1* 1/2014 Li .................. F21V 9/00
                                                    353/31
2014/0028983 A1* 1/2014 Fujita .............. F21V 7/00
                                                    353/30

FOREIGN PATENT DOCUMENTS

| JP | 2012094439 A | 5/2012 |
| JP | 2012164561 A | 8/2012 |

* cited by examiner

LIGHT SOURCE DEVICE AND PROJECTOR

BACKGROUND

1. Technical Field

The present invention relates to a light source device and a projector equipped with the light source device.

2. Related Art

In the past, there has been known a projector, which modulates light emitted from a light source device in accordance with image information, and then projects the light. In such a projector, there has been used a discharge light source device as the light source device in the past. However, in recent years, the chance of using a light emitting device such as a light emitting diode (LED) or a semiconductor laser has increased. Further, there has been used a light source device for performing wavelength conversion on the light from the semiconductor laser or the like using a fluorescent material.

JP-A-2005-277331 (Document 1) discloses a light emitting device provided with a light transmissive member including a fluorescent material and a reflecting member as a reflecting surface in order to improve the efficiency of the light (fluorescence) on which the wavelength conversion has been performed.

However, in the light emitting device (a light source device) of Document 1, the light, which has been emitted from the fluorescent material and has reached the side surface of the light transmissive member, is reflected by the reflecting surface toward the inside of the light transmissive member. However, an experiment having been conducted by the inventors shows the fact that although a part of the light having returned to the inside of the light transmissive member is emitted from an upper surface of the light transmissive member, the remaining component thereof is confined in the inside of the light transmissive member, and fails to be used as the light for illumination. Therefore, sufficient improvement effect in the efficiency of the fluorescence is not obtained.

Therefore, there have been demanded a light source device capable of improving the efficiency of the fluorescence and a projector equipped with the light source.

SUMMARY

An advantage of some aspects of the invention is to solve at least a part of the problems described above, and the invention can be implemented as following aspects or application examples.

Application Example 1

A light source device according to this application example includes (a) a phosphor layer having a side surface, a bottom surface, and an upper surface opposed to the bottom surface, and adapted to generate fluorescence in response to irradiation with excitation light, (b) a substrate disposed on the bottom surface side of the phosphor layer, and (c) a reflecting member disposed outside the phosphor layer, the fluorescence generated in the phosphor layer is emitted from the upper surface and the side surface, and the fluorescence emitted from the side surface out of the fluorescence generated in the phosphor layer enters the reflecting member.

According to such a light source device as described above, the fluorescence emitted from the side surface of the phosphor layer enters and then reflected by the reflecting member disposed outside the phosphor layer, and can therefore be used as the light for illumination. Thus, the light source device with the improved efficiency of the fluorescence can be realized.

Application Example 2

In the light source device according to the application example described above, it is preferable that the reflecting member diffusely reflects the fluorescence emitted from the side surface.

According to such a light source device as described above, the reflecting member can diffusely reflect the fluorescence emitted from the side surface. Thus, at least a part of the fluorescence having been emitted from the side surface is reflected by the reflecting member toward the upper surface side of the phosphor layer with respect to the substrate. Therefore, it is possible to make effective use of the fluorescence having been emitted from the side surface as the light for the illumination.

Application Example 3

In the light source device according to the application example described above, it is preferable that the reflecting member has a tilted surface tilted so as to get further away from the side surface toward the upper surface from the bottom surface of the phosphor layer.

According to such a light source device as described above, the fluorescence emitted from the side surface of the phosphor layer is reflected by the tilted surface of the reflecting member toward the upper surface side of the phosphor layer with respect to the substrate. Therefore, it is possible to make effective use of the fluorescence having been emitted from the side surface as the light for the illumination.

Application Example 4

In the light source device according to the application example described above, it is preferable that the tilted surface has a curved surface in a vicinity of the bottom surface of the phosphor layer.

According to such a light source device as described above, since the multiple reflection between the curved surface and the side surface of the phosphor layer can be reduced by the curved surface provided to the tilted surface, it is possible to inhibit the fluorescence from being absorbed and attenuated by the phosphor layer. Thus, it is possible to make it easy to emit the fluorescence, which has been emitted from the side surface of the phosphor layer, toward the upper surface side of the phosphor layer with respect to the substrate. Therefore, the efficiency of the fluorescence can be improved.

Application Example 5

In the light source device according to the application example described above, it is preferable to further include a light transmissive member higher in refractive index than air and disposed between the side surface of the phosphor layer and the reflecting member.

According to such a light source device as described above, the reflection due to the total reflection or the like on the side surface of the phosphor layer can be reduced. Therefore, the fluorescence generated in the phosphor layer becomes easy to be emitted to the outside (the light transmissive member) from the side surface of the phosphor layer, and thus, the external quantum efficiency rises.

Application Example 6

In the light source device according to the application example described above, it is preferable that the phosphor layer includes a first base material, and a plurality of phosphor particles dispersed in the first base material, and a refractive index of the first base material is equal to the refractive index of the light transmissive member.

According to such a light source device as described above, since the refractive index of the first base material of the phosphor layer is equal to the refractive index of the light transmissive member, the critical angle of the interface between the phosphor layer and the light transmissive member can be enlarged. Thus, the fluorescence generated in the phosphor layer becomes easy to be emitted to the outside (the light transmissive member) from the side surface of the phosphor layer, and thus, the external quantum efficiency can further be raised.

Application Example 7

In the light source device according to the application example described above, it is preferable that the phosphor layer includes a first base material, and a plurality of phosphor particles dispersed in the first base material, the light transmissive member includes a second base material, and a plurality of particles dispersed in the second base material, a refractive index of the second base material is different from a refractive index of the plurality of particles, and a refractive index of the first base material is equal to the refractive index of the second base material.

According to such a light source device as described above, the light transmissive member includes the second base material and the plurality of particles dispersed in the second base material, and the refractive index of the second base material is different from the refractive index of the plurality of particles. Therefore, the fluorescence having entered the light transmissive member is scattered by the plurality of particles, and therefore, becomes easy to be emitted toward the upper surface side of the phosphor layer with respect to the substrate. Further, since the refractive index of the first base material of the phosphor layer is equal to the refractive index of the second base material of the light transmissive member, the critical angle of the interface between the phosphor layer and the light transmissive member can be enlarged. Thus, the fluorescence generated in the phosphor layer becomes easy to be emitted to the outside (the light transmissive member) from the side surface of the phosphor layer, and thus, the external quantum efficiency can further be raised.

Application Example 8

In the light source device according to the application example described above, it is preferable that the substrate is rotatable around a predetermined rotational axis, and the phosphor layer and the reflecting member are disposed so as to extend along a rotational direction of the substrate.

According to such a light source device as described above, even if the substrate is rotated around the rotational axis, the phosphor layer and the reflecting member are disposed so as to extend along the rotational direction of the substrate, it is possible to make the fluorescence having been emitted from the side surface of the phosphor layer enter and then be reflected by the reflecting member. Further, by rotating the substrate around the rotational axis, the phosphor layer can effectively be cooled. Thus, the degradation of the conversion efficiency of the fluorescent material due to the heat can be reduced.

Application Example 9

In the light source device according to the application example described above, it is preferable to further include a collimating optical system adapted to collimate the fluorescence proceeding toward the upper surface side of the phosphor layer.

According to such a light source device as described above, since the collimating optical system for collimating the fluorescence proceeding toward the upper surface side of the phosphor layer is provided, diffusion of the fluorescence can be reduced, and therefore, the fluorescence can efficiently be guided to the light modulation device.

Application Example 10

A projector according to this application example includes (a) an illumination device adapted to emit illumination light, (b) a light modulation device adapted to modulate the illumination light in accordance with image information to form image light, and (c) a projection optical system adapted to project the image light, and the light source device according to any one of the application examples described above is used as the illumination device.

According to such a projector as described above, by using the light source device with the efficiency of the fluorescence improved as the illumination device, even if the light intensity of the excitation light with which the phosphor layer is irradiated is reduced, the light intensity substantially the same in luminance as in the related art can be obtained to thereby keep the brightness of the projection image in substantially the same level as in the related art. Further, in the case of irradiating the phosphor layer with the excitation light substantially the same in light intensity as in the related art, since the brightness of the light source device can be improved compared to the related art, the brightness of the projection image can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments of the invention will hereinafter be explained with reference to the accompanying drawings.

First Embodiment

Figure 1:
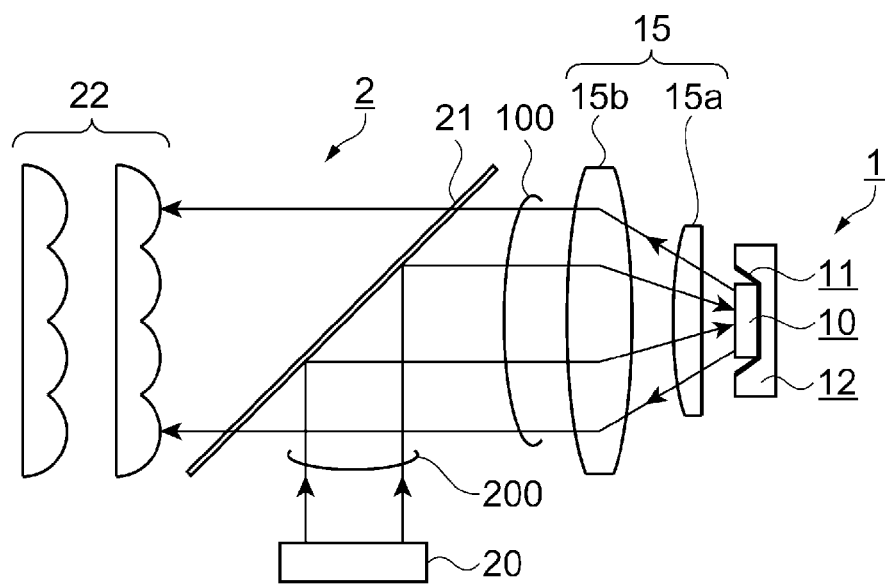
FIG. 1 is a schematic configuration diagram showing an illumination device using a light source device according to a first embodiment.

FIG. 1 is a schematic configuration diagram showing an illumination device 2 using a light source device 1 according to a first embodiment. The configuration of the illumination device 2 (the light source device 1) will be explained with reference to FIG. 1.

As shown in FIG. 1, the light source device 1 is provided with a phosphor layer 10, a reflecting member 11, a substrate 12, and a collimating optical system 15. Further, the illumination device 2 is provided with an excitation light source 20, a dichroic mirror 21, a lens array 22, and so on in addition to the light source device 1.

The phosphor layer 10 generates and then emits the fluorescence in response to irradiation with the excitation light. It should be noted that the details of the phosphor layer 10 will be described later.

The excitation light source 20 irradiates the phosphor layer 10 with the excitation light. As the excitation light source 20, a laser source for emitting blue light (having a wavelength of about 445 nm) is used in the present embodiment. It should be noted that the excitation light source 20 can be formed a single laser source or a plurality of laser sources. Further, the laser source for emitting blue light with the wavelength other than 445 nm (e.g., 460 nm) as the blue light can also be used.

The dichroic mirror 21 is an optical member for reflecting the excitation light (the blue light) emitted by the excitation light source 20 so as to bend as much as 90 degrees. The excitation light source 20 is configured so as to emit the excitation light as roughly parallel light. The dichroic mirror 21 reflects the excitation light as the parallel light to guide the excitation light to the phosphor layer 10.

In the present embodiment, the collimating optical system 15 is an optical system constituted by a first lens 15a and a second lens 15b, and for collecting the excitation light as the parallel light having been reflected by the dichroic mirror 21, and then irradiating an upper surface 10a (see FIG. 2) of the phosphor layer 10 with the excitation light. Further, the collimating optical system 15 has a function of converting the fluorescence emitted by the phosphor layer 10 to roughly parallel light. Therefore, the phosphor layer 10 is disposed at a focal position of the collimating optical system 15.

The lens array 22 divides the fluorescence having been transmitted through the dichroic mirror 21 into a plurality of divided light beams using a small lens group constituting the lens array 22. Then, by making the divided light beams overlap each other in an illuminated area, the illuminated area is irradiated at an even illuminance.

The excitation light 200 emitted by the excitation light source 20 is reflected by the dichroic mirror 21, and then enters the collimating optical system 15. The excitation light 200 is collected by the collimating optical system 15, and then the phosphor layer 10 is irradiated with the excitation light thus collected. Due to the excitation light 200 with which the phosphor layer 10 is irradiated, the phosphor layer 10 generates and then emits the fluorescence 100. The fluorescence 100 thus emitted is roughly collimated by the collimating optical system 15, and is then transmitted through the dichroic mirror 21, and then enters the lens array 22.

Figure 2:
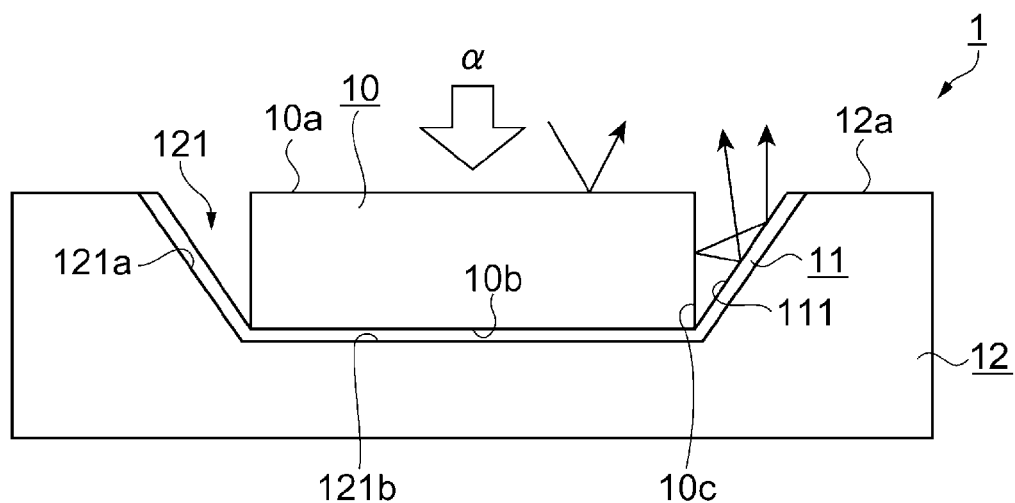
FIG. 2 is a cross-sectional view showing a configuration of the light source device.

FIG. 2 is a cross-sectional view showing a configuration of the light source device 1. In FIG. 2, the collimating optical system 15 is omitted. The configuration and an operation of the light source device 1 will be explained with reference to FIG. 2.

As shown in FIG. 2, the light source device 1 is provided with the phosphor layer 10 formed to have a roughly square planar shape (with the upper surface 10a, a bottom surface 10b, and side surfaces 10c), the substrate 12 disposed on the bottom surface 10b side of the phosphor layer 10, and the reflecting member 11 disposed outside the phosphor layer 10. It should be noted that the phosphor layer 10 can also have a columnar shape. It should be noted that in the present specification, it is assumed that the upper surface 10a side of the phosphor layer 10 is the upper side, and the bottom surface 10b side of the phosphor layer 10 is the lower side.

The substrate 12 having a plate-like shape is provided with a recessed section 121 having a roughly square planar shape. The recessed section 121 is formed so as to obliquely expand in four directions upward from a bottom surface 121b having a roughly square shape. The reflecting member 11 is formed on an inner surface of the recessed section 121. Further, the phosphor layer 10 is disposed at the center (of the bottom surface 121b) of the recessed section 121 on which the reflecting member 11 is formed.

In other words, as shown in FIG. 2, the reflecting member 11 has a tilted surface 111 tilted so that the distance from the side surface 10c increases toward the upper surface 10a from the bottom surface 10b of the phosphor layer 10. The tilted surface 111 is tilted at a predetermined angle.

It should be noted that the phosphor layer 10 is an optical member, which is excited by light in the ultraviolet range through the blue range to emit light. The phosphor layer 10 is configured including a base material (a first base material) and a plurality of phosphor particles dispersed in the first base material (both not shown).

As the phosphor particles, a rare earth fluorescent material, a sialon fluorescent material, or the like can be used. In detail, $Y_3Al_5O_{12}$:Ce(YAG:Ce) can be used as the rare earth fluorescent material, and α-sialon or the like can be used as the sialon fluorescent material. Further, as the phosphor layer 10, a sintered body obtained by mixing the phosphor particles and alumina or the like as the first base material with each other, a material formed of glass or resin as the first base material including the phosphor particles, or the like can be used. Further, a sintered body formed only of the phosphor particles or the like can be used.

The reflecting member 11 is formed of metal (e.g., silver and aluminum) high in reflectance, an optical multilayer film, or ceramics including gas pockets. Further, a member having particles (including air), which are different in refractive index from the base material, dispersed in the base material such as glass or resin can also be used as the reflecting member 11. It should be noted that in the present embodiment, the reflecting member 11 has a tilted surface 111 for performing diffuse reflection.

The substrate 12 is formed of metal (copper) in the present embodiment. It should be noted that it is preferable for the substrate 12 to be formed of metal high in thermal conductivity besides copper from a viewpoint of the radiation performance.

An operation of the light source device 1 will be explained. As shown in FIG. 2, in the case in which the excitation light α (the blue light in the present embodiment) has entered the phosphor layer 10 from the excitation light source 20, the phosphor particles is excited and generates the fluorescence (a yellow light beam including a red light beam and a green light beam in the present embodiment). Most part of the fluorescence generated is emitted upward (an incident direction of the excitation light α) from the upper surface 10a of the phosphor layer 10, and a part of the fluorescence is emitted externally from the side surface 10c. The fluorescence emitted from the side surface 10c is diffusely-reflected by the tilted surface 111 of the reflecting member 11 as indicated by the arrows. Although a part of the fluorescence reflected by the tilted surface 111 returns again to the phosphor layer 10, the most part is emitted toward the upper surface 10a side (an upward direction) of the phosphor layer 10 with respect to the substrate 12. It should be noted that the fluorescence having been emitted upward from the upper surface 10a of the phosphor layer 10, and the fluorescence having been emitted from the side surface 10c of the phosphor layer 10 and then reflected by the tilted surface 111 to be emitted upward are roughly collimated by the collimating optical system 15 shown in FIG. 1.

In the light source device 1 according to the present embodiment, an area surrounded by an upper end of the reflecting member 11 in a planar view is assumed as the light emitting area. Therefore, the collimating optical system 15 is configured so as to take in the light dispersed within a range of about ±80 degrees centered on the normal line of the upper surface 10a with respect not only to the fluorescence emitted from the upper surface 10a of the phosphor layer 10, but also to the fluorescence emitted from an end portion of the uppermost portion of the reflecting member 11.

Figure 3:
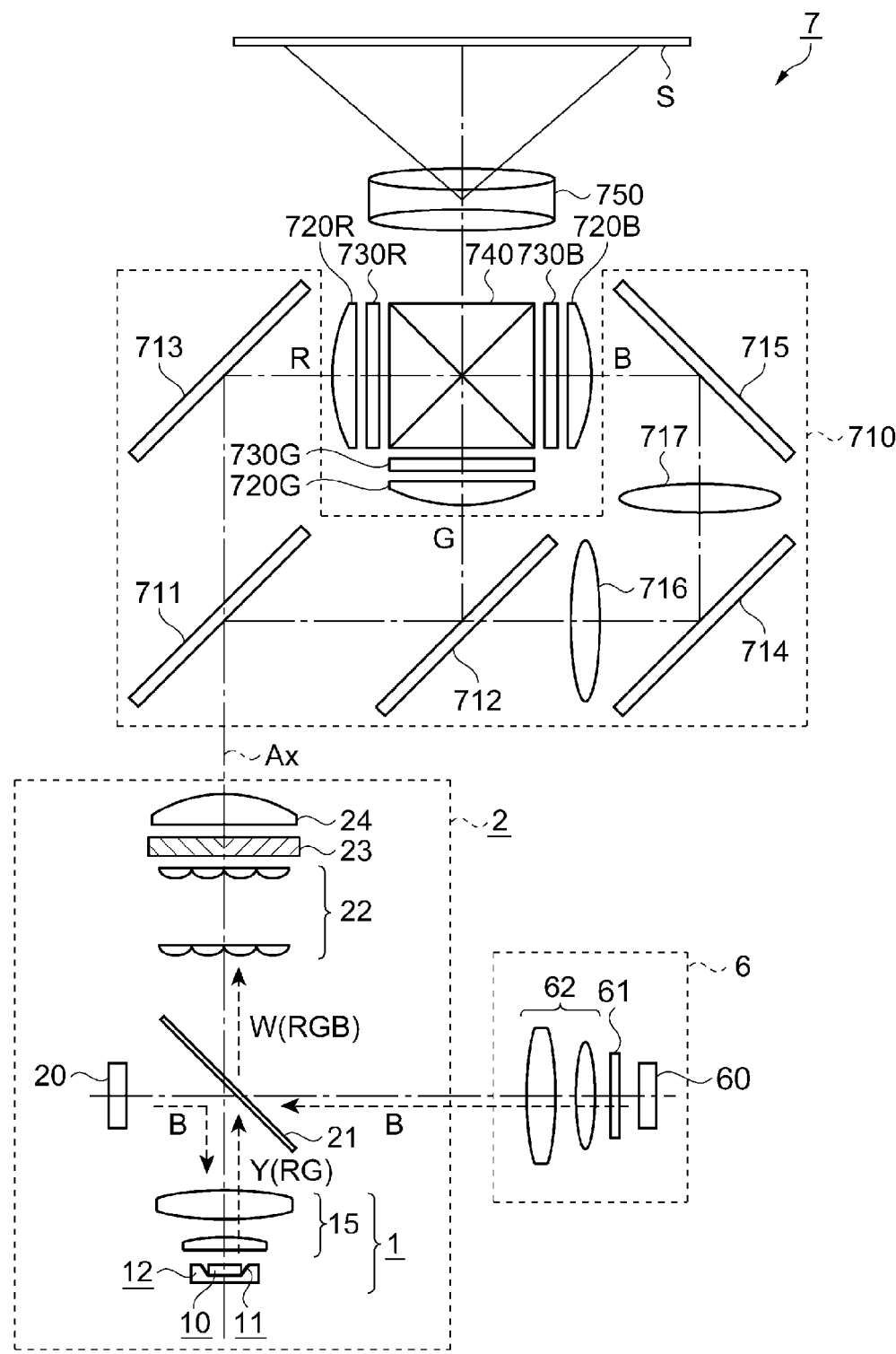
FIG. 3 is a diagram showing a configuration of an optical system of a projector using the illumination device (the light source device).

FIG. 3 is a diagram showing a configuration of an optical system of the projector 7 using the illumination device 2 (the light source device 1). The configuration of the optical system of the projector 7 will be explained with reference to FIG. 3.

As shown in FIG. 3, the projector 7 is provided with the illumination device 2, a second illumination device 6, a color separation optical system 710, three liquid crystal panels 730R, 730G, and 730B as a light modulation device, a cross dichroic prism 740, and a projection optical system 750.

The illumination device 2 is provided with the light source device 1 (the phosphor layer 10, the reflecting member 11, the substrate 12, and the collimating optical system 15 in the present embodiment), the excitation light source 20, the dichroic mirror 21, the lens array 22, a polarization conversion element 23, and an overlapping lens 24.

The illumination device 2 reflects the excitation light α: the blue light beam (B) emitted from the excitation light source 20 (the laser light source) using the dichroic mirror 21, and then collects the excitation light α: the blue light beam (B) thus reflected using the collimating optical system 15, and then irradiates the phosphor layer 10 with the excitation light α: the blue light beam (B) thus collected. The phosphor layer 10 emits the fluorescence toward the collimating optical system 15 due to the excitation light α thus input. It should be noted that the phosphor layer 10 emits the yellow light beam (Y) including the red light beam (R) and the green light beam (G) as the fluorescence. The collimating optical system 15 roughly collimates the fluorescence, and then emits the fluorescence thus collimated toward the dichroic mirror 21.

The second illumination device 6 is formed of a light source 60 (a laser source), a scattering plate 61, and a collimating optical system 62. The scattering plate 61 scatters the blue light beam (B) emitted from the light source 60 at a predetermined scattering degree to convert the blue light beam (B) into the blue light beam (B) having a light distribution similar to the fluorescence from the light source device 1. The collimating optical system 62 suppresses spreading of the light from the light source 60, and further, roughly collimates the light, and then emits the light to the dichroic mirror 21.

The dichroic mirror 21 functions as a color combining element for combining the light (the blue light beam (B)) from the second illumination device 6 and the light (the yellow light beam (Y)) from the light source device 1 with each other. The dichroic mirror 21 reflects the light (the blue light beam (B)) from the second illumination device 6 so as to bend the blue light beam (B) as much as roughly 90 degrees, and at the same time, transmits the light (the yellow light beam (Y)) from the light source device 1, to thereby emit the light (white light (W: RGB) for the sake of convenience) obtained by combining the colored light beams with each other to the lens array 22.

The lens array 22 divides the incident light into a plurality of divided light beams, and then emits the divided light beams to the polarization conversion element 23.

The polarization conversion element 23 converts the polarization directions of the divided light beams divided into by the lens array 22, and then emits a roughly unique linearly-polarized light beam having a uniform polarization direction.

The overlapping lens 24 collects each of the divided light beams from the polarization conversion element 23, and overlaps the divided light beams in the image forming areas (illumination target areas) of the liquid crystal panels 730R, 730G, and 730B. The lens array 22 and the overlapping lens 24 constitute an integrator optical system for homogenizing the illuminance distribution in each the illumination target areas.

The color separation optical system 710 is provided with dichroic mirrors 711, 712, reflecting mirrors 713, 714, and 715, and relay lens 716, 717. The color separation optical system 710 separates the light from the illumination device 2 into the red light beam, the green light beam, and the blue light beam, and guides the colored light beams of the red light beam, the green light beam, and the blue light beam respectively to the liquid crystal panels 730R, 730G, and 730B to be the illumination target. Collecting lenses 720R, 720G, and 720B are disposed between the color separation optical system 710 and the liquid crystal panels 730R, 730G, and 730B, respectively.

The dichroic mirrors 711, 712 each have a wavelength selecting transmissive film, which reflects the light in a predetermined wavelength band and transmits the light in another wavelength band, formed on a substrate. The dichroic mirror 711 transmits the red light component and reflects the green light component and the blue light component. The dichroic mirror 712 reflects the green light component while transmitting the blue light component. The reflecting mirror 713 reflects the red light component. The reflecting mirrors 714, 715 reflect the blue light component.

The red light beam having been transmitted through the dichroic mirror 711 is reflected by the reflecting mirror 713, and then enters the image forming area of the liquid crystal panel 730R for the red light beam passing through the collecting lens 720R. Further, the green light beam having been reflected by the dichroic mirror 711 is further reflected by the dichroic mirror 712, and then enters the image forming area of the liquid crystal panel 730G for the green light beam passing through the collecting lens 720G. The blue light beam having passed through the dichroic mirror 712 enters the image forming area of the liquid crystal panel 730B for the blue light beam via the relay lens 716, the reflecting mirror 714 on the entrance side, the relay lens 717, the reflecting mirror 715 on the exit side, and the collecting lens 720B. The relay lenses 716, 717, and the reflecting mirrors 714, 715 guide the blue light component, which has been transmitted through the dichroic mirror 712, to the liquid crystal panel 730B.

It should be noted that the reason that the relay lenses 716, 717 are provided to the light path of the blue light beam is that the length of the light path of the blue light beam is larger than the lengths of the light paths of the other colored light beams, degradation of the efficiency of the light due to the dispersion or the like of the light is prevented. In the projector 7 according to the present embodiment, it is also possible to adopt a configuration in which the length of the light path of the red light beam is elongated instead of the blue light beam, and the relay lenses 716, 717 and the reflecting mirrors 714, 715 are used on the light path of the red light beam.

The liquid crystal panels 730R, 730G, and 730B are for modulating the respective incident colored light beams in accordance with the image information to thereby form color image light, and are the illumination target of the illumination device 2. It should be noted that, although not shown in the drawings, the entrance side polarization plates are disposed between the collecting lenses 720R, 720G, and 720B and the liquid crystal panels 730R, 730G, and 730B, respectively, so as to intervene therebetween, and the exit side polarization plates are disposed between the liquid crystal panels 730R, 730G, and 730B and the cross dichroic prism 740, respectively, so as to intervene therebetween. The light modulation of the respective incident colored light beams is performed by the entrance side polarization plates, the liquid crystal panels 730R, 730G, and 730B, and the exit side polarization plates, respectively.

The liquid crystal panels 730R, 730G, and 730B are each a transmissive panel formed by encapsulating a liquid crystal material as an electro-optic material between a pair of transparent glass plates, and each modulate the polarization direction of the unique linearly polarized light, which has been emitted from the corresponding entrance side polarization plate, in accordance with image information provided thereto using, for example, polysilicon TFTs as switching elements.

The cross dichroic prism 740 is an optical element for combining the optical images modulated for respective colored light beams and then emitted from the respective exit side polarization plates to thereby form the color image light. The cross dichroic prism 740 has a substantially rectangular planar shape formed of four rectangular prisms bonded to each other, and on the substantially X-shaped interfaces on which the rectangular prisms are bonded to each other, there are formed optical multilayer films. The optical multilayer film formed on one of the roughly X-shaped interfaces is for reflecting the red light beam, and the optical multilayer film formed on the other of the interfaces is for reflecting the blue light beam. The red light beam and the blue light beam are respectively bent by these optical multilayer films to have the proceeding directions aligned with the proceeding direction of the green light beam, thus the three colored light beams are combined with each other.

The color image light emitted from the cross dichroic prism 740 is projected in an enlarged manner by the projection optical system 750 to form a projection image (a color image) on the screen S.

In the second illumination device 6, it is also possible to adopt a configuration having a collecting optical system inserted between the light source 60 and the scattering plate 61 to thereby collect the blue light beam (B) from the light source 60 in the vicinity of the scattering plate 61.

According to the light source device 1 and the projector 7 using the light source device 1 of the present embodiment, the following advantages can be obtained.

In the light source device 1 according to the present embodiment, since the fluorescence emitted from the side surface 10c of the phosphor layer 10 enters and is then reflected by the reflecting member 11, the fluorescence emitted from the side surface 10c can be used as the light for the illumination. Thus, the light source device 1 improving the efficiency of the fluorescence can be realized.

In the light source device 1 according to the present embodiment, the reflecting member 11 has the tilted surface 111 tilted so that the distance from the side surface 10c increase toward the upper surface 10a from the bottom surface 10b of the phosphor layer 10. Therefore, the fluorescence emitted from the side surface 10c of the phosphor layer 10 is reflected by the tilted surface 111 of the reflecting member 11 toward the upper surface 10a side of the phosphor layer 10 with respect to the substrate 12. Therefore, it is possible to make effective use of the fluorescence having been emitted from the side surface 10c as the light for the illumination.

Further, the reflecting member 11 has a tilted surface 111 that performs the diffuse reflection. Therefore, even if the tilt angle of the tilted surface 111 from the normal line of the upper surface 10a is 0 degree, at least a part of the fluorescence emitted from the side surface 10c is reflected upward by the reflecting member 11. Therefore, it is possible to make effective use of the fluorescence having been emitted from the side surface 10c as the light for the illumination.

In the projector 7 according to the present embodiment, by using the light source device 1 with the efficiency of the fluorescence improved as the illumination device 2, even if the light intensity of the excitation light with which the phosphor layer 10 is irradiated is reduced, the light intensity substantially the same in luminance as in the related art can be obtained to thereby keep the brightness of the projection image in substantially the same level as in the related art. Further, in the case of irradiating the phosphor layer 10 with the excitation light substantially the same in light intensity as in the related art, since the brightness of the light source device 1 can be improved compared to the related art, the brightness of the projection image can be improved.

In the projector 7 according to the present embodiment, since the light intensity of the excitation light with which the phosphor layer 10 is irradiated can be reduced, it is possible to reduce the power consumption to thereby achieve energy saving.

In the light source device 1 according to the present embodiment, the substrate 12 is formed of metal (copper) high in thermal conductivity. Thus, since it is possible to efficiently transfer the heat generated in the phosphor layer 10 to the substrate 12, and to efficiently radiate the heat from the substrate 12, it is possible to efficiently cool the light source device 1.

It should be noted that although in the present embodiment, the reflecting member 11 has the tilted surface 111 that performs the diffuse reflection, the invention is not limited to this configuration. In the case in which the reflecting member 11 is a member for diffusely reflecting the light, the tilt angle of the tilted surface 111 can be 0 degree. Further, in the case in which the tilt angle of the tilted surface 111 is larger than 0 degree, the reflecting member 11 is not required to have a function of diffusing the light.

Second Embodiment

Figure 4:
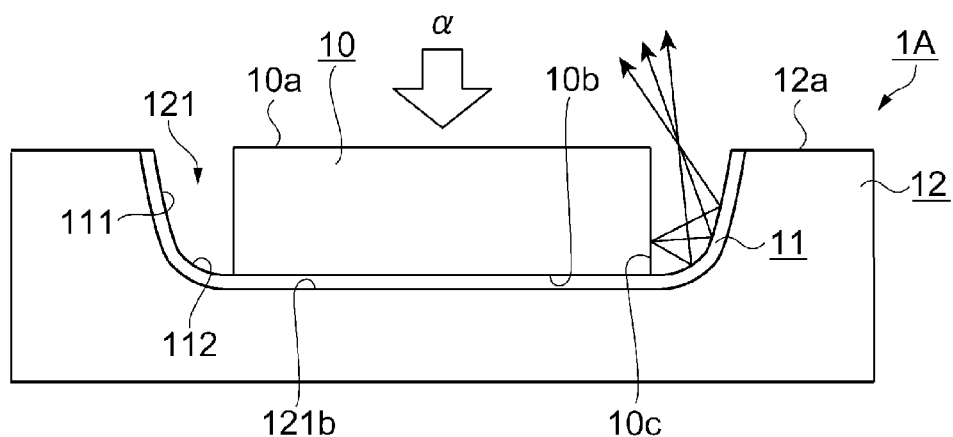
FIG. 4 is a cross-sectional view showing a configuration of a light source device according to a second embodiment of the invention.

FIG. 4 is a cross-sectional view showing a configuration of a light source device 1A according to a second embodiment. The configuration and an operation of the light source device 1A will be explained with reference to FIG. 4.

As shown in FIG. 4, the light source device 1A according to the present embodiment is different in the cross-sectional shape of the reflecting member from the light source device 1 according to the first embodiment. The rest of the configuration is substantially the same as that of the first embodiment. Therefore, the constituents substantially the same as those of the first embodiment will be denoted with the same reference symbols as in the first embodiment, and the explanation thereof will be omitted.

In order to improve the usage efficiency of the light, which has been emitted from the light source device, in the optical system in the posterior stage, it is preferable to make the light emitting area small. To that end, it is possible to decrease the tilt angle of the tilted surface 111 to thereby decrease the area surrounded by the upper end of the reflecting member 11 in the planar view. However, if the tilt angle of the tilted surface 111 is decreased, multiple reflection occurs between the reflecting member 11 and the side surface 10c in the lower area of the tilted surface 111. Further, among the fluorescence, which has been reflected by the reflecting member 11, a component returning to the inside of the phosphor layer 10 increases. Therefore, the effect of improving the efficiency of the fluorescence might be degraded.

Therefore, as shown in FIG. 4, the reflecting member 11 of the present embodiment is configured so that the tilted surface 111 has a curved surface 112 in the vicinity of the bottom surface 10b of the phosphor layer 10. Further, the reflecting member 11 is formed of metal, an optical multi-layer film, or the like to have a configuration of performing mirror reflection, and the multiple reflection in the vicinity of the bottom surface 10b of the phosphor layer 10 is suppressed by the curved surface 112. Therefore, the fluorescence emitted from the side surface 10c of the phosphor layer 10 is reflected by the curved surface 112 and is emitted upward as indicated by the arrows. It should be noted that in the present specification, mirror reflection denotes the reflection not accompanied by diffusion.

It should be noted that the light source device 1A according to the present embodiment can be applied to the projector 7 in the description of the first embodiment by replacing the light source device 1 according to the first embodiment.

In the light source device 1A according to the present embodiment, the reflecting member 11 (the tilted surface 111) has the curved surface in the vicinity of the bottom surface 10b of the phosphor layer 10, and further, the reflecting member performs the mirror reflection. Thus, it is possible to reduce the multiple reflection between the curved surface 112 and the side surface 10c of the phosphor layer 10 in the vicinity of the bottom surface 10b of the phosphor layer 10 to thereby inhibit the fluorescence from being absorbed and attenuated by the phosphor layer 10. Therefore, since it is possible to facilitate upward emission of the fluorescence emitted from the side surface 10c of the phosphor layer 10, the usage efficiency of the fluorescence can be improved.

In the light source device 1A according to the present embodiment, since the reflecting member 11 (the tilted surface 111) has the curved surface 112 in the vicinity of the bottom surface 10b of the phosphor layer 10, the distance between the upper end portion of the tilted surface 111 and the side surface 10c of the phosphor layer 10 can be shortened to thereby decrease the light emitting area (the area of the region where the fluorescence is emitted upward). Thus, it is possible to further improve the usage efficiency of the fluorescence in the posterior optical system, and at the same time, achieve miniaturization of the light source device 1A.

Third Embodiment

Figure 5A:
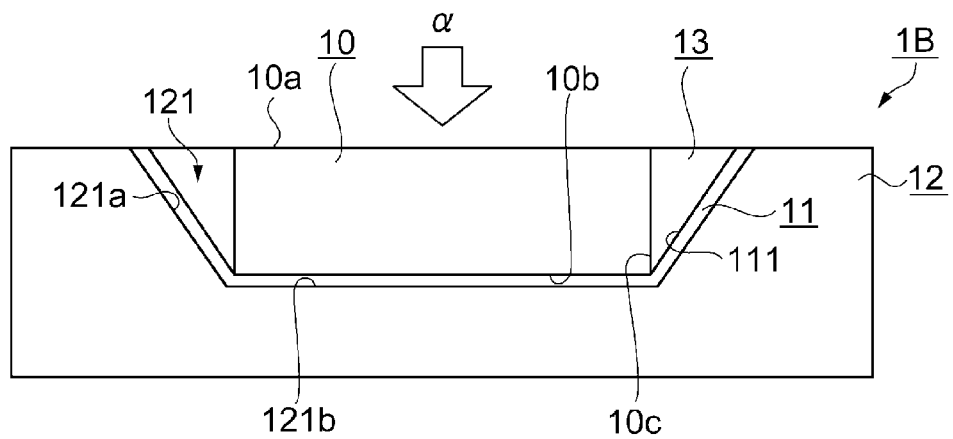
FIGS. 5A and 5B are cross-sectional views each showing a configuration of a light source device according to a third embodiment of the invention.
Figure 5B:
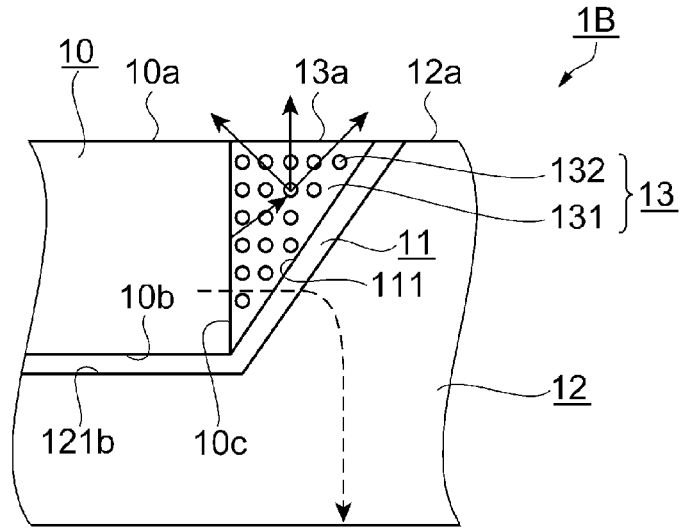

FIGS. 5A and 5B are cross-sectional views showing a configuration of a light source device 1B according to the third embodiment of the invention, wherein FIG. 5A is a cross-sectional view, and FIG. 5B is an enlarged view of the cross-sectional view. The configuration and an operation of the light source device 1B will be explained with reference to FIGS. 5A and 5B.

As shown in FIGS. 5A and 5B, the light source device 1B according to the present embodiment is different from the light source device 1 according to the first embodiment in that a light transmissive member 13 higher in refractive index than air is disposed between the side surface 10c of the phosphor layer 10 and the reflecting member 11. The rest of the configuration is substantially the same as that of the first embodiment. Therefore, the constituents substantially the same as those of the first embodiment will be denoted with the same reference symbols as in the first embodiment, and the explanation thereof will be omitted.

It should be noted that in the light source device 1 according to the first embodiment, in the case of forming the phosphor layer 10 with, for example, a sintered body made only of the YAG fluorescent material, since angle conversion due to the difference in refractive index in the inside of the phosphor layer 10 is difficult to occur, the fluorescence becomes difficult to be emitted from the inside to the outside of the phosphor layer 10, and thus a so-called external quantum efficiency is degraded. In the first embodiment, in the case of the phosphor layer 10 formed of the sintered body made only of the YAG fluorescent material, the fluorescence having entered the interface between the phosphor layer 10 and the air at an angle larger than the critical angle (about 33.3 degree) is totally reflected by the interface, and is not emitted to the outside. Therefore, according to the present embodiment, the external quantum efficiency is improved by disposing the light transmissive member 13.

The light transmissive member 13 is a member for transmitting the fluorescence emitted from the side surface 10c of the phosphor layer 10, and performs one of linear transmission and diffuse transmission. Here, the linear transmission denotes that the incident light is transmitted without being diffused. It should be noted that in the case in which the light transmissive member 13 linearly transmits the fluorescence, it is preferable for the reflecting member 11 to have a configuration of performing the diffuse reflection. Further, in the case in which the light transmissive member 13 diffusely transmits the fluorescence, either of the configuration of performing the diffuse reflection and the configuration of performing the mirror reflection can be adopted as the configuration of the reflecting member 11. Further, it is preferable for the light transmissive member 13 to be formed of a member such as ceramics, which has a refractive index close to that of the phosphor layer 10, and is high in thermal conductivity.

FIG. 5B is a diagram schematically showing the fact that the light transmissive member 13 is formed of a second base material 131 and a plurality of particles 132 dispersed in the second base material 131. It should be noted that the light transmissive member 13 can also be formed only of the second base material 131. As the second base material, alumina, glass, or the like can be used. Further, as the particles 132, the YAG material with the fluorescent substance not activated can be used. It should be noted that it is also possible to include air as the particles 132.

In the case in which the light transmissive member 13 is formed of a member for linearly transmitting the light in the light source device 1B according to the present embodiment, by using a material having a characteristic of performing the diffuse reflection, such as ceramics, as the reflecting member 11, the component out of the fluorescence having been transmitted through the light transmissive member 13, which is diffusely reflected by the reflecting member 11 and is then emitted upward from the upper surface 13a of the light transmissive member 13, increases.

In this case if the configuration of using alumina as the first base material and the YAG fluorescent material as the phosphor particles is adopted as the phosphor layer 10, and the configuration formed only of alumina is adopted as the light transmissive member 13, the refractive index of the first base material of the phosphor layer 10 and the refractive index of the light transmissive member 13 can be made equal to each other. Thus, it is possible to enlarge the critical angle of the interface between the phosphor layer 10 and the light transmissive member 13. Thus, the total reflection on the interface (the side surface 10c of the phosphor layer 10) between the phosphor layer 10 and the light transmissive member 13 can be reduced. It becomes easy for the fluorescence generated in the phosphor layer 10 to be emitted from the side surface 10c of the phosphor layer 10 to the light transmissive member 13, and it is possible to further raise the external quantum efficiency.

Further, in the case in which the light transmissive member 13 is a member for diffusely transmitting the light, by adopting the configuration of the light transmissive member 13 in which alumina is used as the second base material 131, and the YAG material is included as the particles 132, the refractive index of the first base material of the phosphor layer 10 and the refractive index of the second base material 131 of the light transmissive member 13 can be made equal to each other. Thus, it is possible to enlarge the critical angle of the interface between the phosphor layer 10 and the light transmissive member 13. Thus, the total reflection on the side surface 10c can be reduced, and it becomes easy for the fluorescence generated in the phosphor layer 10 to be emitted from the side surface 10c of the phosphor layer 10 to the light transmissive member 13. Therefore, it is possible to further raise the external quantum efficiency. It should be noted that as the first base material and the second base material 131, glass or the like can also be used besides alumina. It should be noted that in FIG. 5B, the action of the fluorescence emitted from the side surface 10c of the phosphor layer 10 to the light transmissive member 13 is schematically indicated by the arrows.

It should be noted that as an example, by using the sintered body of alumina (with a refractive index of about 1.76) and the YAG fluorescent material as the phosphor layer 10, and a polycrystalline sintered body (with a refractive index of 1.79) of alumina (50 vol %) and YAG (50 vol %) as the light transmissive member 13, the refractive index can be made roughly equal between the first base material and the light transmissive member 13. Further, in this case, the critical angle becomes about 79.5 degree, and most of the fluorescence excited in the phosphor layer 10 is emitted from the side surface 10c of the phosphor layer 10 to the light transmissive member 13. Then, the fluorescence having entered the light transmissive member 13 is diffused by repeating the angle conversion due to the difference in refractive index between alumina and the YAG material, and the component emitted upward from the upper surface 13a of the light transmissive member 13 increases. Thus, the external quantum efficiency can be improved.

In the light source device 1B according to the present embodiment, by using a member having a high thermal conductivity such as alumina (with a thermal conductivity of 30 W/mK) as the light transmissive member 13, it is possible to increase a thermal path for releasing the heat generated in the phosphor layer 10 from the side surface 10c of the phosphor layer 10 to the substrate 12 via the light transmissive member 13 as indicated by the dotted arrow shown in FIG. 5B, and it is possible to efficiently cool the phosphor layer 10. Further, since the phosphor layer 10 can efficiently be cooled, the conversion efficiency of the phosphor layer 10 can be inhibited from degrading. As a result, the brightness of the illumination light can be improved.

It should be noted that the light source device 1B according to the present embodiment can be applied to the projector 7 in the description of the first embodiment by replacing the light source device 1 according to the first embodiment.

It should be noted that in the present embodiment, in the case in which the light transmissive member 13 is formed of a member for diffusely transmitting the fluorescence, the tilt angle of the reflecting member 11 from the normal line of the upper surface 10a of the phosphor layer 10 can be set to 0 degree. Even in this case, the fluorescence is emitted upward due to the diffuse transmission. Further, the light emitting area of the light source device 1B can be miniaturized.

Fourth Embodiment

Figure 6A:
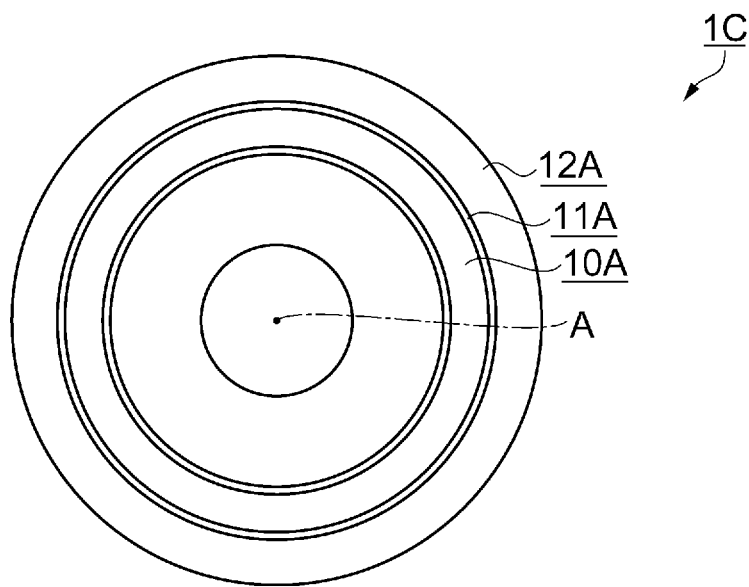
FIGS. 6A and 6B are diagrams each showing a configuration of a light source device according to a fourth embodiment of the invention.
Figure 6B:
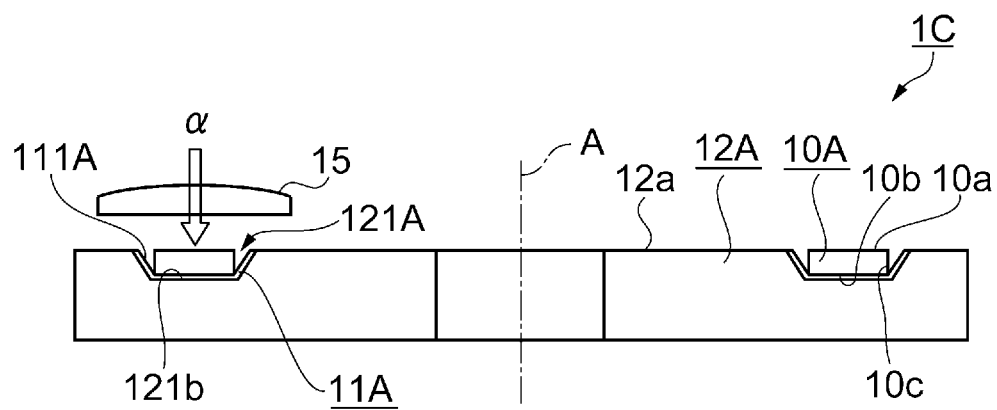

FIGS. 6A and 6B are diagrams showing a configuration of a light source device 1C according to a fourth embodiment of the invention, wherein FIG. 6A is a plan view of the light source device 1C, and FIG. 6B is a cross-sectional view of the light source device 1C. The configuration and an operation of the light source device 1C will be explained with reference to FIGS. 6A and 6B.

As shown in FIGS. 6A and 6B, the light source device 1C according to the present embodiment is formed of a wheel substrate 12A as the substrate, a phosphor layer 10A, and a reflecting member 11A. The wheel substrate 12A is formed to have a plate-like shape having a circular planar shape centered on a predetermined rotational axis A, and is configured so as to be able to rotate around the rotational axis A. The phosphor layer 10A and the reflecting member 11A are formed so as to extend along the rotational direction of the wheel substrate 12A.

As shown in FIG. 6B, the phosphor layer 10A and the reflecting member 11A of the light source device 1C are configured similarly to those of the light source device 1 (the phosphor layer 10 and the reflecting member 11) according to the first embodiment in the cross-sectional view.

As shown in FIGS. 6A and 6B, the phosphor layer 10A is formed to have a roughly doughnut shape having the upper surface 10a, the bottom surface 10b, and the side surface 10c. The wheel substrate 12A is provided with a recessed section 121A having a ring-like shape centered on the rotational axis A formed on an upper surface 12a. The recessed section 121A is formed so as to expand in inner and outer directions upward from a bottom surface 121b having a ring-like shape. The reflecting member 11A is formed on an inner surface of the recessed section 121A. Further, the phosphor layer 10A is disposed on the bottom surface 121b of the recessed section 121A on which the reflecting member 11A is formed. It should be noted that in other words, as shown in FIG. 6B, the reflecting member 11A has a tilted surface 111A tilted so that the distance from the side surface 10c increase toward the upper surface 10a from the bottom surface 10b of the phosphor layer 10A. The tilted surface 111A is tilted at a predetermined angle.

It should be noted that the phosphor layer 10A of the present embodiment is irradiated with the excitation light α from above. Further, the phosphor layer 10A emits the fluorescence while the area irradiated with the excitation light α is moving as the wheel substrate 12A rotates.

Further, the light source device 1C according to the present embodiment is provided with the collimating optical system 15 disposed above the upper surface 10a of the phosphor layer 10A so as to correspond to the fluorescence emitted from the phosphor layer 10A. Further, the collimating optical system 15 roughly collimates the fluorescence emitted from the upper surface 10a of the phosphor layer 10A and the fluorescence reflected upward by the reflecting member 11A.

The same constituent materials as those of the phosphor layer 10 and the reflecting member 11 of the first embodiment can be applied to the phosphor layer 10A and the reflecting member 11A.

As the wheel substrate 12A, there can be used metal, ceramics (oxide or nitride), glass, carbon, resin, and so on. Further, by using glass, high-temperature resin, or the like incorporating metal, ceramics, carbon, filler metal, or the like as the wheel substrate 12A, it is possible to prevent the wheel substrate 12A from deforming due to the rotation, or deforming due to the heat generated in the phosphor layer 10A. Further, by diffusing such heat in a wide range to increase the area having contact with the air, the cooling performance of the light source device 1C can be improved.

According to the light source device 1C related to the present embodiment, since the phosphor layer 10A and the reflecting member 11A are disposed so as to extend along the rotational direction of the wheel substrate 12A, even if rotating the wheel substrate 12A around the rotational axis A, it is possible to make the fluorescence emitted from the side surface 10c of the phosphor layer 10A enter the reflecting member 11A and be reflected toward the incident direction of the excitation light α (upward). Further, it is possible to roughly collimate and then emit the fluorescence having been emitted toward the incident direction of the excitation light α using the collimating optical system 15. Thus, substantially the same advantages as those of the light source device 1 according to the first embodiment can be obtained.

It should be noted that the configuration of providing the curved surface 112 to the tilted surface 111 of the reflecting member 11 according to the second embodiment can also be applied as the light source device 1C according to the present embodiment. Further, the configuration of forming the light transmissive member 13 according to the third embodiment can also be applied.

Fifth Embodiment

Figure 7A:
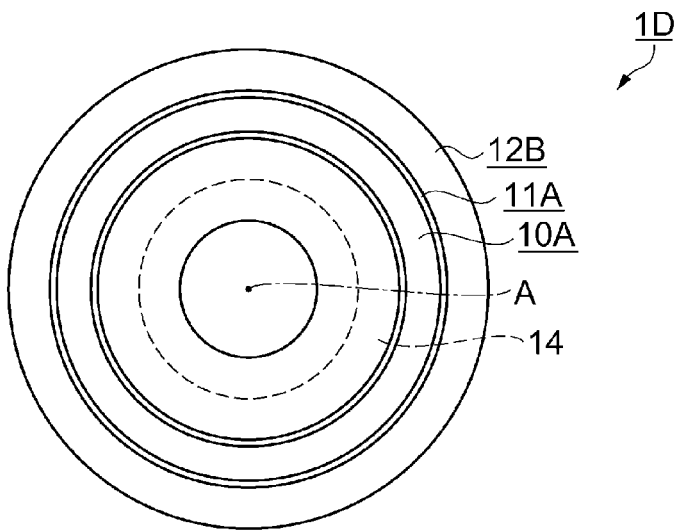
FIGS. 7A through 7C are diagrams each showing a configuration of a light source device according to a fifth embodiment of the invention.
Figure 7B:
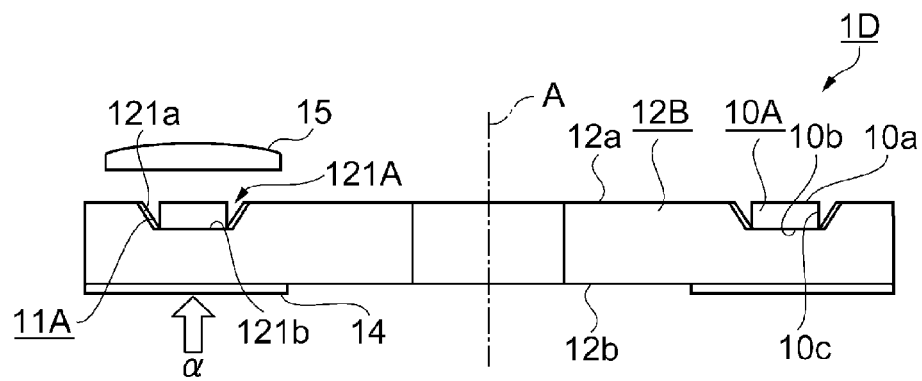
Figure 7C:
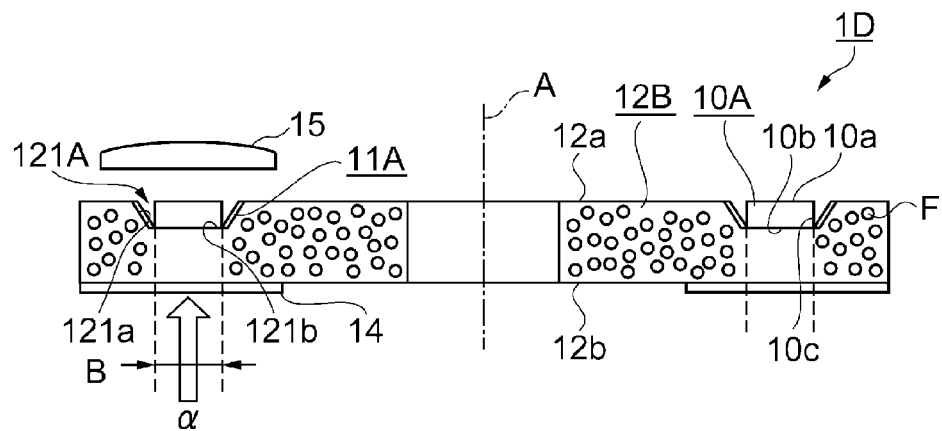

FIGS. 7A through 7C are diagrams showing a configuration of a light source device 1D according to a fifth embodiment of the invention, wherein FIG. 7A is a plan view of the light source device 1D, FIG. 7B is a cross-sectional view of the light source device 1D, and FIG. 7C is a cross-sectional view of the light source device 1D obtained by changing the material of a wheel substrate 12B shown in FIG. 7B. The configuration and an operation of the light source device 1D will be explained with reference to FIGS. 7A through 7C.

As shown in FIGS. 7A through 7C, in the light source device 1D according to the present embodiment, incident direction of the excitation light α to the phosphor layer 10A is opposite to the incident direction of the excitation light α in the fourth embodiment compared to the light source device 1C according to the fourth embodiment. Further, due to the above, the configuration of the wheel substrate 12B and the arrangement position of the reflecting member 11A are different. Further, it is different to add a dichroic mirror 14.

It should be noted that the phosphor layer 10A of the light source device 1D is configured similarly to the fourth embodiment. Therefore, the constituents substantially the same as those of the fourth embodiment will be denoted with the same reference symbols as in the fourth embodiment, and the explanation thereof will be omitted.

As shown in FIGS. 7B and 7C, the reflecting member 11A of the present embodiment is not disposed on the bottom surface 10b side of the phosphor layer 10A. In other words, the reflecting member 11A is not disposed on the bottom surface 121b of the recessed section 121A of the wheel substrate 12B, but is disposed only on the tilted surface 121a of the recessed section 121A.

In the light source device 1D, the excitation light α enters the phosphor layer 10A from the bottom surface 10b side. Therefore, a light transmissive member is used as the wheel substrate 12B. As the light transmissive member, for example, ceramics (e.g., alumina, YAG), glass, and high-temperature resin can be used. FIG. 7B is a diagram using the light transmissive member as the wheel substrate 12B.

Further, as shown in FIG. 7C, as the wheel substrate 12B, it is possible to use glass, high-temperature resin, or the like incorporating metal, nitride ceramics, or the like as filler F. In such a case, the filler F is not incorporated in an area B (the area corresponding to the bottom surface 10b of the phosphor layer 10A), through which the excitation light α is transmitted, so that absorption or reflection of the excitation light α does not occur whereas the filler F is incorporated in the rest of the area.

By using glass, high-temperature resin, or the like incorporating metal, nitride ceramics having a high thermal conductivity, or the like as the filler F as the wheel substrate 12B in such a manner, it is possible to prevent the wheel substrate 12B from deforming due to the rotation, or deforming due to the heat generated in the phosphor layer 10A. Further, by diffusing such heat in a wide range to increase the area having contact with the air, the cooling performance of the light source device 1D can be improved.

As shown in FIGS. 7B and 7C, the dichroic mirror 14 is disposed on the lower surface 12b of the wheel substrate 12B at a position (including the area B) corresponding to the phosphor layer 10A. The dichroic mirror 14 is formed of an optical multilayer film or the like in the present embodiment, and transmits the blue light beam, and reflects the light (the red light beam and the green light beam) on the longer wavelength side than the blue light beam.

According to the light source device 1D related to the present embodiment, the excitation light α enters the dichroic mirror 14, and the excitation light α (the blue light beam) having been transmitted through the dichroic mirror 14 is transmitted through the wheel substrate 12B. Then, the bottom surface 10b of the phosphor layer 10A is irradiated with the excitation light α. Thus, the phosphor layer 10A generates the fluorescence.

It should be noted that the fluorescence having been emitted from the bottom surface 10b of the phosphor layer 10A toward the lower surface 12b of the wheel substrate 12B is transmitted through the wheel substrate 12B, then reflected by the dichroic mirror 14 toward the upper surface 10a of the phosphor layer 10A, and then emitted upward (toward the collimating optical system 15) from the upper surface 10a of the phosphor layer 10A. Meanwhile, the fluorescence having been emitted from the side surface 10c of the phosphor layer 10A is efficiently emitted upward (toward the collimator optical system 15) using the reflecting member 11A. It should be noted that the light having entered the collimating optical system 15 is roughly collimated.

The phosphor layer 10A according to the present embodiment converts apart of the blue light beam having entered from the bottom surface 10b into the light including the red light beam and the green light beam, and at the same time transmits the remaining part of the blue light beam without performing the conversion. Therefore, the light entering the collimating optical system. 15 is converted into light (a white light beam for the sake of convenience) including the red light beam, the green light beam, and the blue light beam. It should be noted that as described above, in the phosphor layer 10A of the present embodiment, the concentration, the thickness of the layer, and so on of the fluorescent material are set so as to transmit a part of the blue light beam.

According to the light source device 1D related to the present embodiment, since the phosphor layer 10A and the reflecting member 11A are disposed so as to extend along the rotational direction of the wheel substrate 12B, even if rotating the wheel substrate 12B around the rotational axis A, it is possible to make the fluorescence emitted from the side surface 10c of the phosphor layer 10A enter the reflecting member 11A and be reflected toward the collimating optical system 15. Further, the collimating optical system is capable of roughly collimating the fluorescence having entered the collimating optical system 15, and then emitting the fluorescence. Thus, substantially the same advantages as those of the light source device 1 according to the first embodiment can be obtained.

It should be noted that the configuration of providing the curved surface 112 to the tilted surface 111 of the reflecting member 11 according to the second embodiment can also be applied as the light source device 1D according to the present embodiment. Further, the configuration of forming the light transmissive member 13 according to the third embodiment can also be applied. It should be noted that it is assumed that the reflecting member 11A is not disposed on the bottom surface 10b (the bottom surface 121b of the wheel substrate 12B) of the phosphor layer 10A.

Sixth Embodiment

Figure 8A:
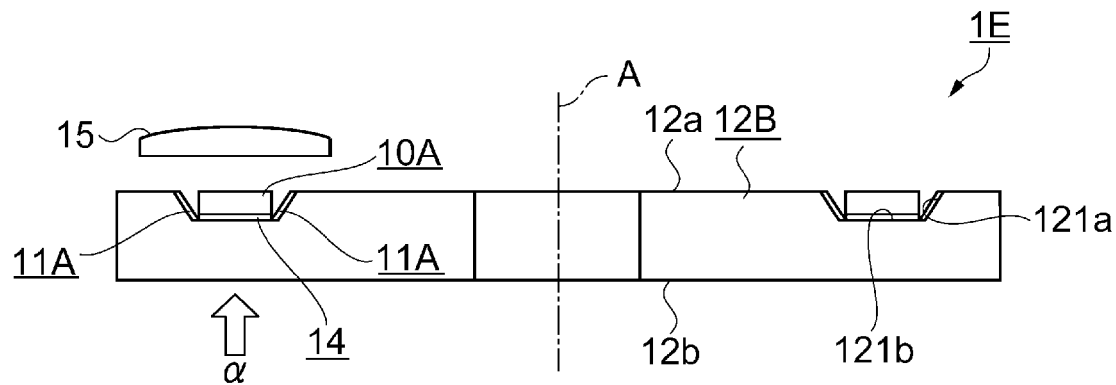
FIGS. 8A and 8B are diagrams each showing a configuration of a light source device according to a sixth embodiment of the invention.
Figure 8B:
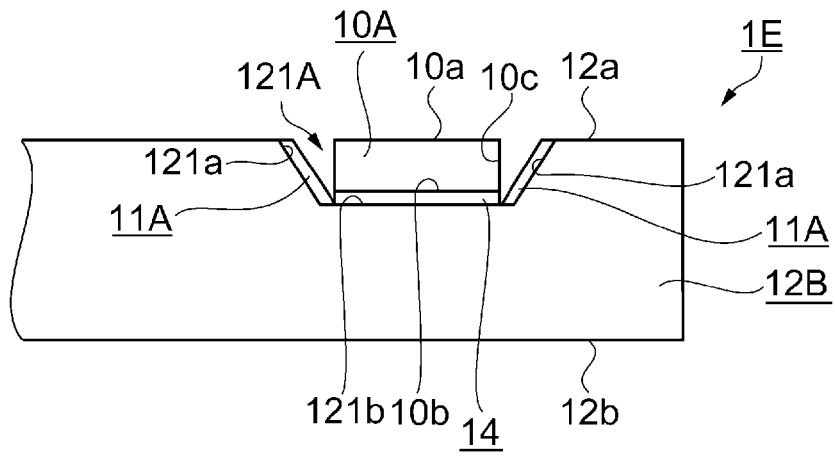

FIGS. 8A and 8B are diagrams showing a configuration of a light source device 1E according to a sixth embodiment. It should be noted that FIGS. 8A and 8B each show the cross-sectional view of the light source device 1E. The configuration and an operation of the light source device 1E will be explained with reference to FIGS. 8A and 8B.

As shown in FIGS. 8A and 8B, the light source device 1E according to the present embodiment is different from the light source device 1D according to the fifth embodiment in the point that the position of the dichroic mirror 14 is changed. The rest of the configuration is substantially the same as that of the fifth embodiment. Therefore, the constituents substantially the same as those of the fifth embodiment will be denoted with the same reference symbols as in the fifth embodiment, and the explanation thereof will be omitted.

The dichroic mirror 14 according to the present embodiment is disposed on the bottom surface 121b of the recessed section 121A of the wheel substrate 12B. Therefore, the dichroic mirror 14 is in the state of being sandwiched between the bottom surface 10b of the phosphor layer 10A and the bottom surface 121b of the wheel substrate 12B.

According to the light source device 1E related to the present embodiment, the excitation light α having entered the wheel substrate 12B from the lower surface 12b of the wheel substrate 12B is transmitted through the wheel substrate 12B. Then, the excitation light α having been transmitted through the wheel substrate 12B enters the dichroic mirror 14, and the bottom surface 10b of the phosphor layer 10A is irradiated with the excitation light α (the blue light beam) having been transmitted through the dichroic mirror 14. Thus, the phosphor layer 10A generates the fluorescence. It should be noted that the relationship of the colors of the fluorescence becomes substantially the same as that of the light source device 1D according to the fifth embodiment.

It should be noted that the fluorescence having been emitted from the bottom surface 10b of the phosphor layer 10A toward the dichroic mirror 14 located in the downward direction is reflected by the dichroic mirror 14 toward the upper surface 10a of the phosphor layer 10A, and then emitted upward (toward the collimating optical system 15) from the upper surface 10a of the phosphor layer 10A. Meanwhile, the fluorescence having been emitted from the side surface 10c of the phosphor layer 10A is efficiently emitted upward (toward the collimator optical system 15) using the reflecting member 11A. It should be noted that the light having entered the collimating optical system 15 is roughly collimated.

According to the light source device 1E related to the present embodiment, since the phosphor layer 10A and the reflecting member 11A are disposed so as to extend along the rotational direction of the wheel substrate 12B, even if rotating the wheel substrate 12B around the rotational axis A, it is possible to make the fluorescence emitted from the side surface 10c of the phosphor layer 10A enter the reflecting member 11A and be reflected toward the collimating optical system 15. Further, the collimating optical system is capable of roughly collimating the fluorescence having entered the collimating optical system 15, and then emitting the fluorescence. Thus, substantially the same advantages as those of the light source device 1 according to the first embodiment can be obtained.

It should be noted that the configuration of providing the curved surface 112 to the tilted surface 111 of the reflecting member 11 according to the second embodiment can also be applied as the light source device 1E according to the present embodiment. Further, the configuration of forming the light transmissive member 13 according to the third embodiment can also be applied. It should be noted that it is assumed that the reflecting member 11A is not disposed on the bottom surface 10*b* (the bottom surface 121*b* of the wheel substrate 12B) of the phosphor layer 10A.

Figure 9:
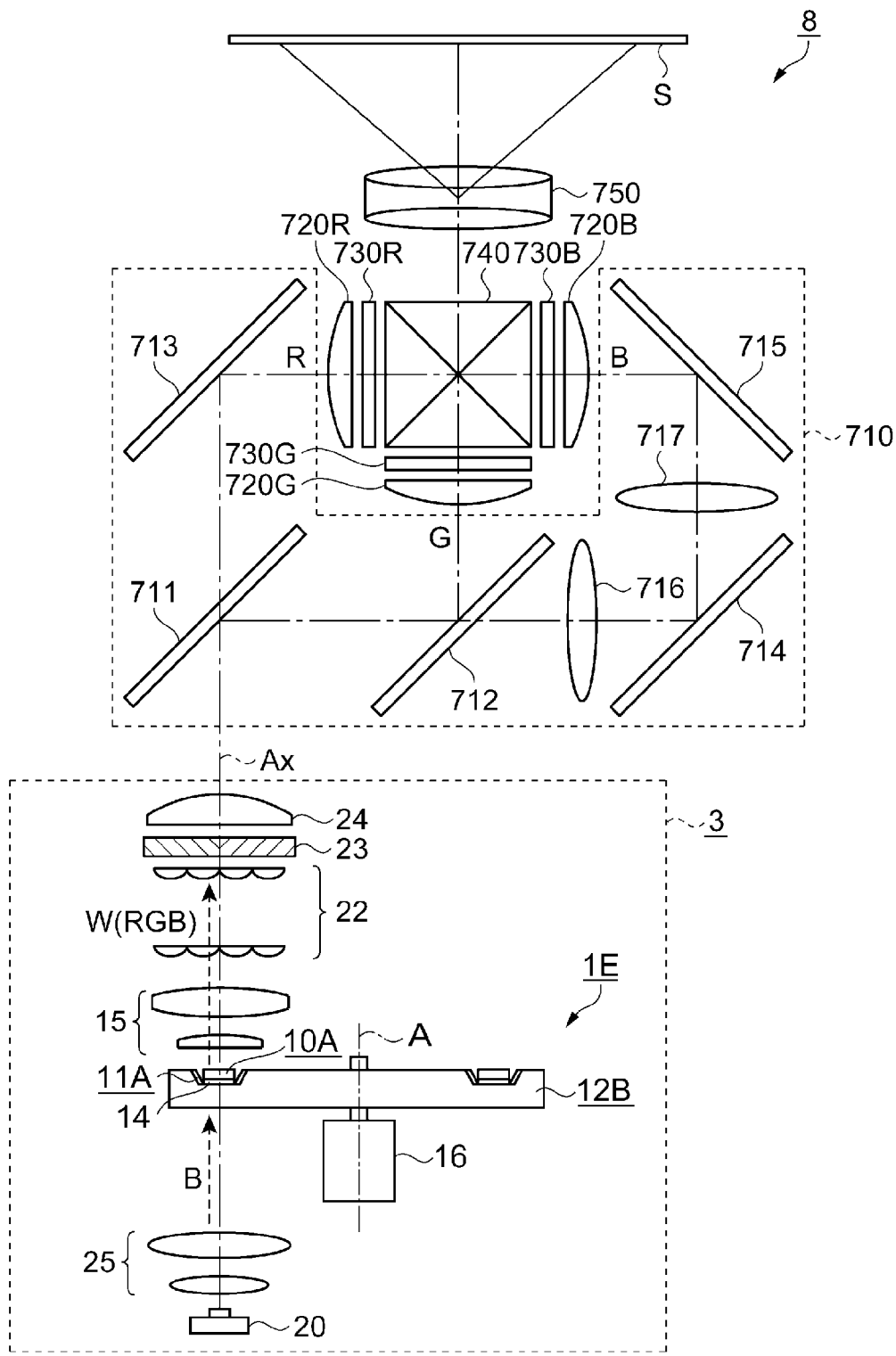
FIG. 9 is a diagram showing a configuration of an optical system of a projector using the light source device.

FIG. 9 is a diagram showing a configuration of an optical system of a projector 8 using the light source device 1E. The configuration of the optical system of the projector 8 will be explained with reference to FIG. 9.

The projector 8 according to the present embodiment is different from the projector 7 according to the first embodiment in the configuration of an illumination device 3 including the light source device 1E. The rest of the configuration is substantially the same as that of the projector 7 according to the first embodiment. Therefore, the constituents substantially the same as those of the projector 7 according to the first embodiment will be denoted with the same reference symbols as in the first embodiment, and the explanation thereof will be omitted.

As shown in FIG. 9, the projector 8 according to the present embodiment is provided with the illumination device 3, the color separation optical system 710, the three liquid crystal panels 730R, 730G, and 730B as the light modulation device, the cross dichroic prism 740, and the projection optical system 750.

The illumination device 3 is provided with the light source device 1E (the phosphor layer 10A, the reflecting member 11A, the wheel substrate 12B, the dichroic mirror 14, and the collimating optical system 15 in the present embodiment), an electric motor 16, the excitation light source 20, a collecting optical system 25, the lens array 22, the polarization conversion element 23, and the overlapping lens 24.

The excitation light source 20 is formed of a laser source for emitting the blue light beam (B) as the excitation light α. The collecting optical system 25 is disposed in a light path from the excitation light source 20 to the wheel substrate 12B, and makes the blue light beam (B) enter the wheel substrate 12B in a roughly collected state.

The wheel substrate 12B is formed so as to be able to be rotated by the electric motor 16, and rotates around the rotational axis A. The wheel substrate 12B rotates at a rotational speed so that the collected light spot of the blue light beam (B) moves on the lower surface 12*b* of the wheel substrate 12B at a predetermined speed.

The blue light beam (B) having entered the wheel substrate 12B is transmitted through the wheel substrate 12B and the dichroic mirror 14, and then the phosphor layer 10A is irradiated with the blue light beam (B). As described above, the phosphor layer 10A converts the excitation light α having entered the phosphor layer 10A into the white light beam (W) including the red light beam (R), the green light beam (G), and the blue light beam (B), and then emits the result. Then, the collimating optical system 15 roughly collimates the fluorescence (the white light beam (W)), and then emits the fluorescence thus collimated toward the lens array 22.

It should be noted that the subsequent operations in the lens array 22, the polarization conversion element 23, and the overlapping lens 24 constituting the illumination device 3 are substantially the same as in the illumination device 2 of the optical system (FIG. 3) of the projector 7 according to the first embodiment, and therefore, the explanation thereof will be omitted. Further, the color separation optical system 710, the three liquid crystal panels 730R, 730G, and 730B as the light modulation device, the cross dichroic prism 740, and the projection optical system 750 formed in the posterior stage of the illumination device 3 are also substantially the same as in the optical system of the projector 7 according to the first embodiment, and therefore, the explanation thereof will be omitted.

In the projector 8 according to the present embodiment, by using the light source device 1E with the efficiency of the fluorescence improved as the illumination device 3, even if the light intensity of the excitation light with which the phosphor layer 10A is irradiated is reduced, the light intensity substantially the same in luminance as in the related art can be obtained to thereby keep the brightness of the projection image in substantially the same level as in the related art. Further, in the case of irradiating the phosphor layer 10A with the excitation light substantially the same in light intensity as in the related art, since the brightness of the light source device 1E can be improved compared to the related art, the brightness of the projection image can be improved.

In the projector 8 according to the present embodiment, since the light intensity of the excitation light with which the phosphor layer 10A is irradiated can be reduced, it is possible to reduce the power consumption to thereby achieve energy saving.

It should be noted that the invention is not limited to the embodiments describe above, but can be put into practice added with a variety of modifications or improvements within the scope or the spirit of the invention. Some modified examples will be described below.

The illumination device 3 of the projector 8 can also be obtained by replacing the light source device 1E according to the sixth embodiment with the light source device 1D according to the fifth embodiment. In this case, it is sufficient to simply replace the light source device 1E with the light source device 1D, and it is not required to change any other constituents.

It is also possible to constitute the projector using the light source device 1C according to the fourth embodiment as the illumination device. In this case, it is sufficient to replace the light source device 1 of the projector 7 (see FIG. 3) explained in the description of the first embodiment with the light source device 1C. Further, in addition thereto, it is sufficient to dispose an electric motor (similar to the electric motor 16 in the sixth embodiment) for rotating the wheel substrate 12A of the light source device 1C at a predetermined speed.

In the projector 7 according to the first embodiment and the projector 8 according to the sixth embodiment, the three liquid crystal panels 730R, 730G, and 730B are adopted as the light modulation device. However, the invention is not limited to this configuration, but a liquid crystal panel for displaying a color image with a single liquid crystal panel can be adopted as the light modulation device.

In the projector 7 according to the first embodiment and the projector 8 according to the sixth embodiment, a transmissive liquid crystal panel (the light modulation device) is adopted as each of the three liquid crystal panels 730R, 730G, and 730B. However, the invention is not limited to this configuration, but it is also possible to adopt a light modulation device of a different type such as a reflective light modulation device, or a micromirror light modulation device. It should be noted that as the micromirror light modulation device, a Digital Micromirror Device, for example, can be used.

The entire disclosure of Japanese Patent Application No. 2014-007539, filed on Jan. 20, 2014 is expressly incorporated by reference herein.

What is claimed is:

1. A light source device comprising:
a phosphor layer having a side surface, a bottom surface, and an upper surface opposed to the bottom surface, and adapted to generate fluorescence in response to irradiation with excitation light;
a substrate disposed on the bottom surface side of the phosphor layer; and
a reflecting member disposed outside the phosphor layer, the reflecting member has a tilted surface tilted so as to get further away from the side surface toward the upper surface from the bottom surface of the phosphor layer,
wherein the fluorescence generated in the phosphor layer is emitted from the upper surface and the side surface, and
the fluorescence is emitted out from the side surface out of the fluorescence generated in the phosphor layer and then enters the reflecting member.

2. The light source device according to claim 1, wherein the reflecting member diffusely reflects the fluorescence emitted from the side surface.

3. A projector comprising:
an illumination device adapted to emit illumination light;
a light modulation device adapted to modulate the illumination light in accordance with image information to form image light; and
a projection optical system adapted to project the image light,
wherein the light source device according to claim 2 is used as the illumination device.

4. The light source device according to claim 1, wherein the tilted surface has a curved surface in a vicinity of the bottom surface of the phosphor layer.

5. A projector comprising:
an illumination device adapted to emit illumination light;
a light modulation device adapted to modulate the illumination light in accordance with image information to form image light; and
a projection optical system adapted to project the image light,
wherein the light source device according to claim 4 is used as the illumination device.

6. The light source device according to claim 1, further comprising:
a light transmissive member higher in refractive index than air and disposed between the side surface of the phosphor layer and the reflecting member.

7. The light source device according to claim 6, wherein the phosphor layer includes a first base material, and a plurality of phosphor particles dispersed in the first base material, and
a refractive index of the first base material is equal to the refractive index of the light transmissive member.

8. A projector comprising:
an illumination device adapted to emit illumination light;
a light modulation device adapted to modulate the illumination light in accordance with image information to form image light; and
a projection optical system adapted to project the image light,
wherein the light source device according to claim 7 is used as the illumination device.

9. The light source device according to claim 6, wherein the phosphor layer includes a first base material, and a plurality of phosphor particles dispersed in the first base material,
the light transmissive member includes a second base material, and a plurality of particles dispersed in the second base material,
a refractive index of the second base material is different from a refractive index of the plurality of particles, and
a refractive index of the first base material is equal to the refractive index of the second base material.

10. A projector comprising:
an illumination device adapted to emit illumination light;
a light modulation device adapted to modulate the illumination light in accordance with image information to form image light; and
a projection optical system adapted to project the image light,
wherein the light source device according to claim 9 is used as the illumination device.

11. A projector comprising:
an illumination device adapted to emit illumination light;
a light modulation device adapted to modulate the illumination light in accordance with image information to form image light; and
a projection optical system adapted to project the image light,
wherein the light source device according to claim 6 is used as the illumination device.

12. The light source device according to claim 1, wherein the substrate is rotatable around a predetermined rotational axis, and
the phosphor layer and the reflecting member are disposed so as to extend along a rotational direction of the substrate.

13. A projector comprising:
an illumination device adapted to emit illumination light;
a light modulation device adapted to modulate the illumination light in accordance with image information to form image light; and
a projection optical system adapted to project the image light,
wherein the light source device according to claim 12 is used as the illumination device.

14. The light source device according to claim 1, further comprising:
a collimating optical system adapted to collimate the fluorescence proceeding toward the upper surface side of the phosphor layer.

15. A projector comprising:
an illumination device adapted to emit illumination light;
a light modulation device adapted to modulate the illumination light in accordance with image information to form image light; and
a projection optical system adapted to project the image light,
wherein the light source device according to claim 14 is used as the illumination device.

16. A projector comprising:
an illumination device adapted to emit illumination light;
a light modulation device adapted to modulate the illumination light in accordance with image information to form image light; and
a projection optical system adapted to project the image light, wherein the light source device according to claim 1 is used as the illumination device.

17. The light source device according to claim 1, further comprising:
a space between the side surface and the reflecting member.

* * * * *